US009535105B2

(12) United States Patent
Phillips et al.

(10) Patent No.: US 9,535,105 B2
(45) Date of Patent: Jan. 3, 2017

(54) APPARATUS AND METHOD FOR MEASURING LEAKAGE CURRENTS ON PORCELAIN AND GLASS INSULATOR DISC STRINGS

(71) Applicant: Electric Power Research Institute, Inc., Charlotte, NC (US)

(72) Inventors: Andrew John Phillips, Harrisburg, NC (US); Christiaan Stephan Engelbrecht, Ede (NL); J. Mark Major, San Antonio, TX (US); Robert Carlton Lynch, Fuquay-Varina, NC (US)

(73) Assignee: Electric Power Research Institute, Inc., Charlotte, NC (US)

( * ) Notice: Subject to any disclaimer, the term of this patent is extended or adjusted under 35 U.S.C. 154(b) by 429 days.

(21) Appl. No.: 14/104,517

(22) Filed: Dec. 12, 2013

(65) Prior Publication Data

US 2015/0168472 A1 Jun. 18, 2015

(51) Int. Cl.
*G01R 31/02* (2006.01)
*G01R 21/12* (2006.01)
*G01R 31/12* (2006.01)

(52) U.S. Cl.
CPC ......... *G01R 31/025* (2013.01); *G01R 31/1245* (2013.01)

(58) Field of Classification Search
CPC .................................................. G01R 31/1245
See application file for complete search history.

(56) References Cited

U.S. PATENT DOCUMENTS

| 3,469,188 A | * | 9/1969 | Hall | ...................... | G01R 27/02 324/102 |
| 4,728,887 A | | 3/1988 | Davis | | |

(Continued)

FOREIGN PATENT DOCUMENTS

| EP | 2006699 | 12/2008 |
| JP | 0062278465 | 12/1987 |

(Continued)

OTHER PUBLICATIONS

Nadal, Rafael, European Search Report for EP Application 14197445, May 5, 2015, Munich.

(Continued)

*Primary Examiner* — WB Perkey
*Assistant Examiner* — Noam Reisner
(74) *Attorney, Agent, or Firm* — Trego, Hines & Ladenheim, PLLC; Brandon Trego; Jonathan Hines (57) ABSTRACT

An apparatus and method for accurately detecting and monitoring leakage currents on porcelain and glass insulator disc strings is disclosed. The sensor apparatus includes a sensor unit configured to attach to a cap of an insulator disc string. The sensor unit includes a sensor disc configured to surround the cap and a housing connected to the sensor disc. The sensor disc includes a conducting lower disc set, a conducting upper disc set, an insulating disc set sandwiched between the upper and lower conducting disc sets, and a conducting mesh connected to a bottom of the lower disc set. The housing including electronics configured to measure and communicate leakage currents on an insulator disc. Leakage currents on a surface of the insulator disc are intercepted by the sensor disc and transferred to the housing for processing and communication by the electronics.

16 Claims, 9 Drawing Sheets

(56) References Cited

U.S. PATENT DOCUMENTS

| | | | |
|---|---|---|---|
| 4,833,415 A * | 5/1989 | Nourai | G01R 31/1245 |
| | | | 324/551 |
| 5,272,442 A * | 12/1993 | Schemmel | G01N 27/221 |
| | | | 324/552 |
| 5,610,512 A | 3/1997 | Selcuk | |
| 5,764,065 A | 6/1998 | Richards et al. | |
| 6,205,867 B1 | 3/2001 | Hayes et al. | |
| 6,523,424 B1 | 2/2003 | Hayes et al. | |
| 6,633,169 B1 | 10/2003 | Cavigelli | |
| 6,788,426 B1 | 9/2004 | Yamanaka et al. | |
| 7,002,331 B2 | 2/2006 | Sae-Ueng et al. | |
| 7,067,829 B2 | 6/2006 | Richards et al. | |
| 7,369,045 B2 | 5/2008 | Hansen | |
| 7,421,258 B2 | 9/2008 | Bauschke et al. | |
| 7,486,084 B2 | 2/2009 | Phillips et al. | |
| 7,494,271 B2 | 2/2009 | Scholtz et al. | |
| 7,615,132 B2 | 11/2009 | Yasui et al. | |
| 7,620,517 B2 | 11/2009 | Scholtz et al. | |
| 7,641,387 B2 | 1/2010 | Engelhardt et al. | |
| 7,748,269 B2 | 7/2010 | Wu et al. | |
| 7,808,250 B2 | 10/2010 | Honda et al. | |
| 2006/0195733 A1* | 8/2006 | DeHaven | G01R 31/3277 |
| | | | 714/724 |
| 2009/0243876 A1 | 10/2009 | Lilien et al. | |
| 2010/0100239 A1 | 4/2010 | Park et al. | |
| 2011/0101989 A1 | 5/2011 | Hyde et al. | |
| 2011/0279278 A1* | 11/2011 | Al-Absi | G08B 21/185 |
| | | | 340/584 |
| 2012/0092115 A1 | 4/2012 | Srinivasrao et al. | |
| 2013/0169285 A1 | 7/2013 | Phillips et al. | |
| 2013/0169286 A1 | 7/2013 | Phillips et al. | |
| 2014/0300486 A1 | 10/2014 | Hummel et al. | |

FOREIGN PATENT DOCUMENTS

| | | |
|---|---|---|
| JP | 2000131258 | 9/2004 |
| RU | 2212678 | 9/2003 |
| RU | 2233754 | 8/2004 |
| RU | 89792 | 12/2009 |
| SU | 724338 | 3/1980 |
| SU | 1305031 | 4/1987 |
| SU | 1642530 | 4/1991 |
| WO | 2007093861 | 8/2007 |

OTHER PUBLICATIONS

A. Semenova, WIPO International Search Report for PCT/US2012/051699, Nov. 9, 2012, Russia.
Y. Usikova, WIPO International Search Report for PCT/US2012/051695, Nov. 21, 2012, Russia.
O. Schedrina, WIPO International Search Report for PCT/US2012/072012, Mar. 13, 2013, Russia.
O. Schedrina, WIPO International Search Report for PCT/US2012/072023, Mar. 21, 2013, Russia.
Sorqvist, Outdoor polymeric insulators long-term exposed to HVDC, IEEE Trans. on Power Delivery, V. 12, No. 2, Apr. 1997, p. 1041-1048.
MetersUSA, Current Transformers Principles of Operation, p. 1-4, no date, www.metersUSA.com.
Vishay, Resistors—Linear—Current Sensing, p. 1-4, 2014.
Meder, How reed switches are used with a permanent magnet, p. 28-34, www.digikey.com, no date.
ASEA, Earth-fault protective relays with open-core current transformers, p. 1-12, Ed. 2, Feb. 1976.
Kurihara, Construction of remote monitoring system for separate measurement of leakage current of outdoor insulators, p. 401-404, Jun. 1-5, 2003, Proc. of 7th Inter. Conf. on Properties and Apps. of Dielectric Materials, Nagaya, Japan.
Pylarinos, Impact of noise related waveforms on long term field leakage current measurements, IEEE Trans on Dielectrics and Electrical Insulation, V.18, No. 1, Feb. 2011, p. 122-129.
OSKF, Current Transformers, p. 1-4, Alstom, no date.
Flex-Core, Current Transformers, Model FC, p. 6-7, www.flex-core.com, no date.

* cited by examiner

APPARATUS AND METHOD FOR MEASURING LEAKAGE CURRENTS ON PORCELAIN AND GLASS INSULATOR DISC STRINGS

BACKGROUND OF THE INVENTION

This application relates generally to the monitoring of leakage currents in a transmission system and, more particularly, to an apparatus and method for accurately detecting and monitoring leakage currents on porcelain and glass insulator disc strings.

In many countries, including the US, wood is utilized as part of the line insulation to improve the basic insulation level (BIL) of the line, as it has been recognized that the lighting performance of transmission lines can be improved by utilizing the wood support or pole. This has, however, not been without problems as there were, and still are, many instances of fires of the wood poles and cross arms caused by low frequency leakage current and sparking on the wood from sources such as leakage current due to insulator contamination despite mitigation measures being taken.

Porcelain and Glass Disc Type Insulators installed on Transmission and Distribution Systems are exposed to contamination, for example from marine salt, road salt and industrial pollutants. This contamination can result in flashover of the insulator, usually under light wetting conditions, e.g. condensation, when the salts and water mix to become a conductive electrolyte. Flashover is a problem in that it results in an outage which interrupts power to utilities customers.

When the salts on the surfaces of an insulator become wet they form an electrolyte which is conductive. Since the one end of the insulator is energized, and the other end is grounded, currents flow along the insulator surfaces. If these currents are large enough arcing will occur (called dry band arcing), this arcing will either extinguish or grow to result in a flashover. The magnitude of the leakage currents that occur under the dry band arcing conditions provide an indication of the risk of the insulator flashing over. If insulators are at risk of flashover due to contamination build-up utilities can wash the insulators or take other measures such as redirect power to other transmission and distribution assets.

Some commonly used mitigation measures are listed below; however, none of these mitigation measures provide a means for monitoring and pinpointing potential leakage current problems so that a utility company can take preventative measures.

1. Wrapping metal bands around the wood pole and connecting it to the insulator hardware. This method has the advantage that the reduction in the "insulated" wood path lengths (used as improvement for the BIL) is limited. The conductor material used for this purpose should be compatible with other hardware not to cause corrosion.

2. A small guard electrode, in the form of a coach screw or a multi-spiked plate (e.g. gang-nail), is fastened to the wood outside the rain shadow area and bonded to the insulator hardware. This method has a minimal effect on the BIL of the structure.

3. Application of conducting paint to cover the high resistance zones around metal to wood interfaces. This method has a minimal effect on the BIL of the structure.

4. Bonding of the insulator hardware together with a conductor. The intension with this bond wire is to "balance" the leakage current so that only a small residual current will flow in the pole. There are two variants to this scheme:

(a) The insulator bases are connected together but not grounded. The ground lead terminates some distance away to realize the required BIL phase-to-ground for induced lightning surges.

(b) The insulator bases can be bonded together and connected to ground. In this case the wood is not utilized anymore as part of the line insulation against lightning. Also here it is important that the material of the bond wire is selected to be compatible with the other hardware used to prevent corrosion.

5. An extension of the previous method is to use steel cross-arms to bond the insulator bases together. The steel cross-arm can either be grounded or be left floating depending on whether or not the utility wants wood as part of the line insulation for lightning performance.

6. Finally the insulators used can be upgraded to those with an improved contamination performance. Other options include regular insulator cleaning or the application of silicone grease to insulators.

BRIEF SUMMARY OF THE INVENTION

These and other shortcomings of the prior art are addressed by the present invention, which provides a leakage current monitoring system that continuously monitors and reports potential leakage current issues to allow an action to be taken to mitigate any potential problems that may arise from the leakage current.

According to one aspect of the invention, a sensor apparatus for detecting and monitoring leakage currents on insulator disc strings of an electrical power system includes a sensor unit configured to attach to a cap of an insulator disc string. The sensor unit includes a sensor disc configured to surround the cap and a housing connected to the sensor disc. The sensor disc includes a conducting lower disc set, a conducting upper disc set, an insulating disc set sandwiched between the upper and lower conducting disc sets, and a conducting mesh connected to a bottom of the lower disc set. The housing including electronics configured to measure and communicate leakage currents on an insulator disc. Leakage currents on a surface of the insulator disc are intercepted by the sensor disc and transferred to the housing for processing and communication by the electronics.

According to another aspect of the invention, a sensor unit configured to attach to a cap of an insulator disc string of an electrical power system and detect and monitor leakage currents flowing on the insulator disc string includes a sensor disc configured to surround and connect to the cap, The sensor disc includes a conducting lower disc set, a conducting upper disc set, an insulating disc set sandwiched between the upper and lower conducting disc sets, and a conducting mesh connected to a bottom of the lower disc set to provide a uniform contact between the sensor disc and a surface of an insulator disc. The sensor unit also includes a housing connected to the upper disc set by a conducting bracket. The housing includes electronics configured to measure and communicate leakage currents on an insulator disc. The electronics include a sensor assembly operable to generate an analog signal proportional to a received leakage current, an electronics module operable to convert the analog signal to a digital value, a communications system operable to wirelessly transmit the digital value to an external receiver, and a transfer lead interconnecting the sensor assembly and the lower disc set. The transfer lead is operable to transfer leakage current from the lower disc set to the sensor assembly. Leakage currents on a surface of the insulator disc are intercepted by the sensor disc and transferred to the housing for processing and communication by the electronics.

According to another aspect of the invention, a method of detecting leakage current in an insulator disc string of an electrical power system includes the steps of providing a sensor unit having a sensor disc configured to surround and attach to a cap of the insulator disc string, and a housing electrically connected to the sensor disc and having electronics configured to measure and communicate leakage currents on an insulator disc of the insulator disc string. The method further including the steps of conducting a leakage current from an insulator disc of the insulator disc string through a lower disc set of the sensor disc to the electronics, and using the electronics to measure and communicate the leakage currents to an external receiver.

BRIEF DESCRIPTION OF THE INVENTION

The subject matter that is regarded as the invention may be best understood by reference to the following description taken in conjunction with the accompanying drawing figures in which.

DETAILED DESCRIPTION OF THE INVENTION

Figure 1:
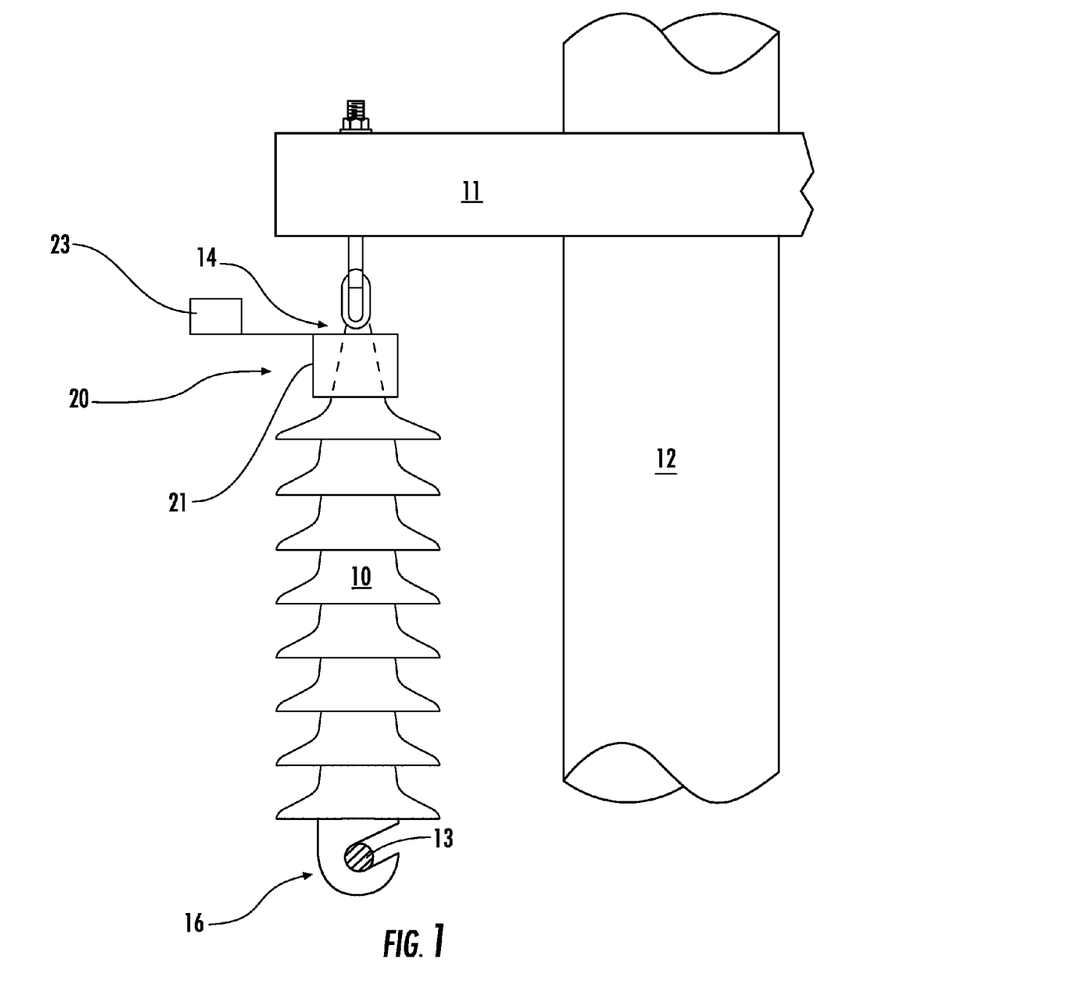
FIG. 1 is a schematic side view of a portion of a utility pole carrying a insulator disc string and a sensor unit constructed according to an aspect of the invention.

Referring to the drawings, wherein identical numerals indicate the same elements throughout the figures, FIG. 1 schematically depicts an insulator string 10 having a plurality of insulator discs connected in series suspended from a cross-arm 11 of a utility pole 12 and which supports an electrical conductor 13. The insulator string 10 is a known disc-type insulator string having a generally cylindrical exterior shape with an upper end or grounded end fitting or cap 14 and a lower end 16 connected to the electrical conductor 13, and is made from an electrically insulating (i.e., non-electrically-conductive) material such as glass or porcelain. An exemplary apparatus in the form of a sensor unit for accurately detecting and monitoring leakage currents according to an embodiment of the invention is mounted on the cap 14 of an upper disc of the insulator string 10 and shown generally at reference numeral 20.

In summary, the sensor unit 20 is an RF sensor which attaches to the last disc in a porcelain/glass insulator string at the grounded end, measures the leakage current flowing in the insulator, processes the current, and assigns them to specific ranges. The sensor then transmits the information wirelessly to either a local base station or a handheld device. Some of the key advantages of the sensor unit 20 include:

1. Not impacted by stray magnetic fields;
2. Does not reduce the dry arc or leakage distance of the insulator string significantly;
3. No wiring is needed to either power the sensor or communicate with the sensor;
4. Increased reliability—previous units that used wiring were notoriously un-reliable due to the wiring, especially since it is applied in a high voltage environment;
5. Ability to quickly deploy many units;
6. The sensor does the processing on-board and provides the user with processed information on which he can make a decision; and
7. By using a combination of analog and digital electronics no current pulses are ever missed—previous technologies that used digital measurement only would only capture leakage currents for small portion of the time—often missing important events.

Figure 2:
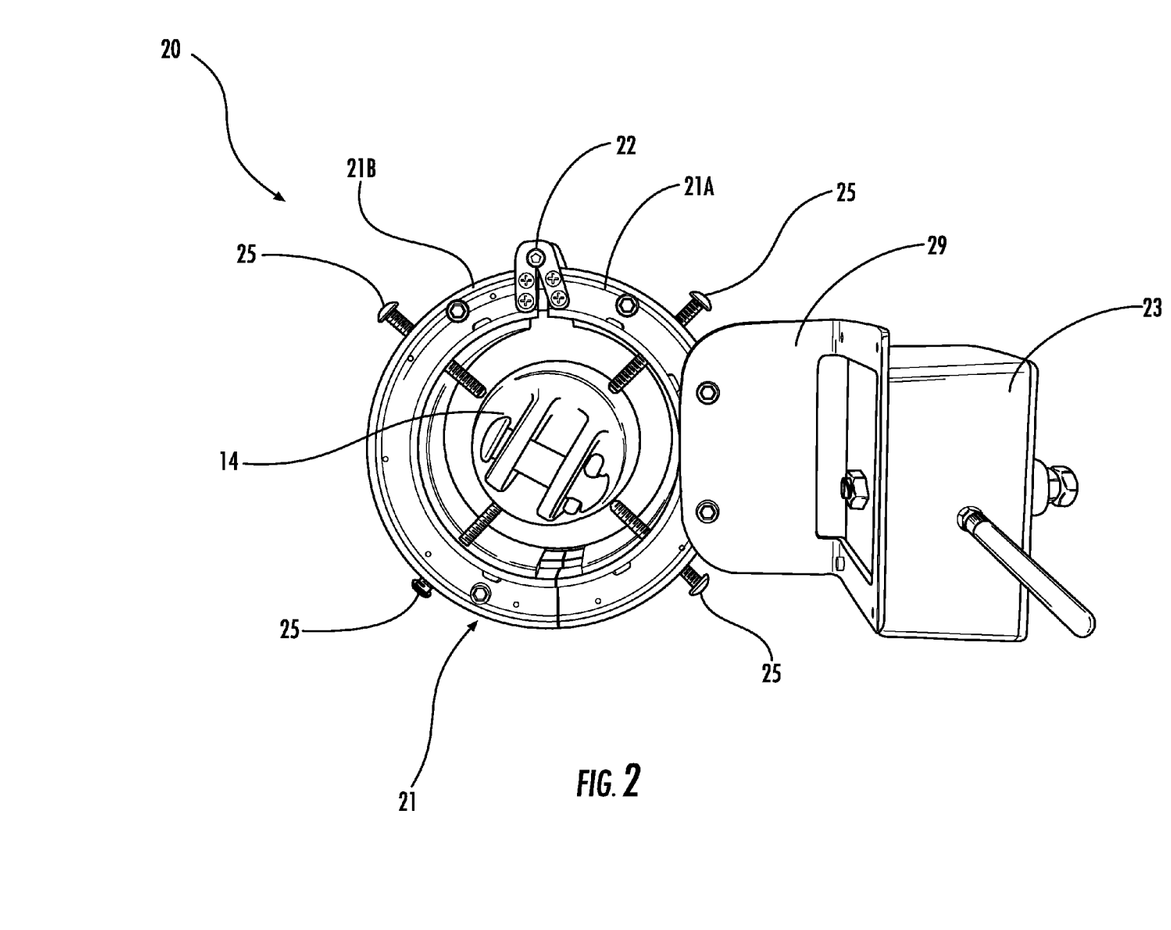
FIG. 2 is a top view of the sensor unit of FIG. 1.
Figure 3:
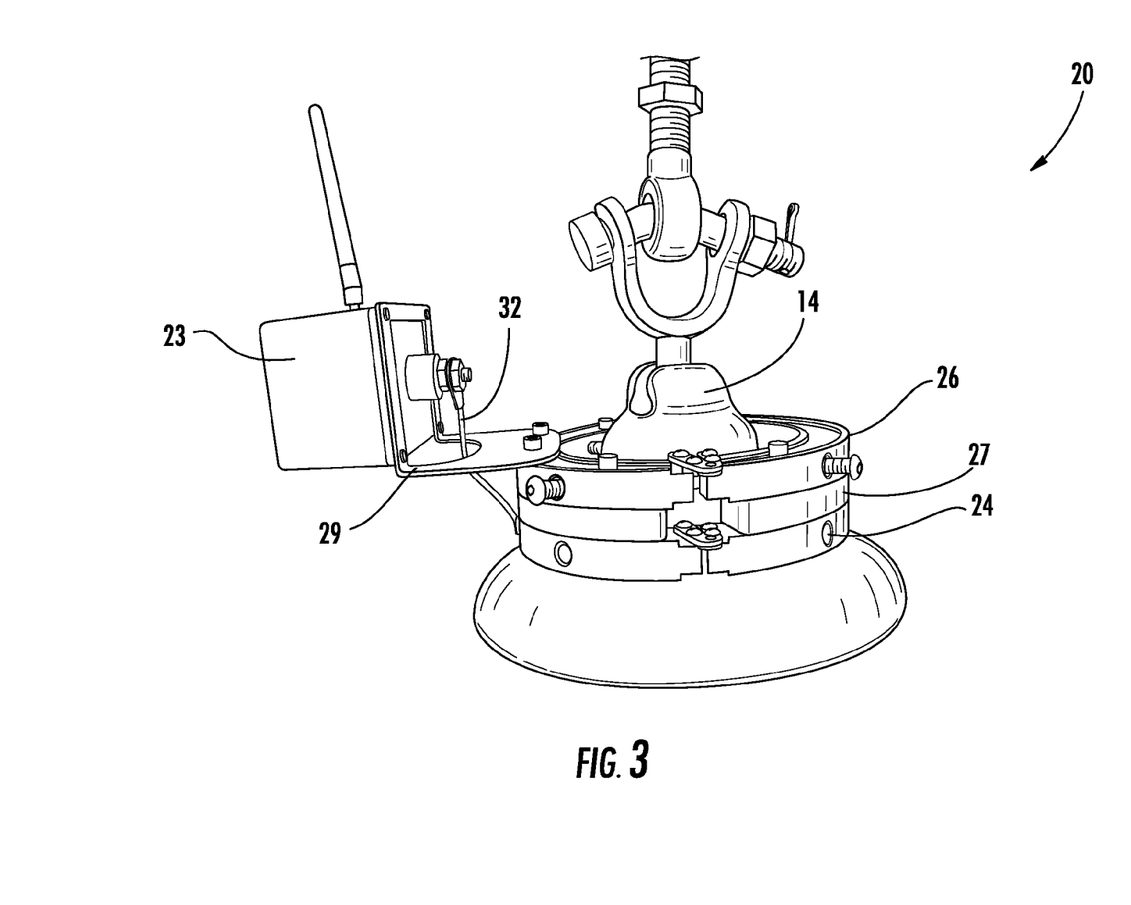
FIG. 3 is a side view of the sensor unit of FIG. 1.
Figure 4:
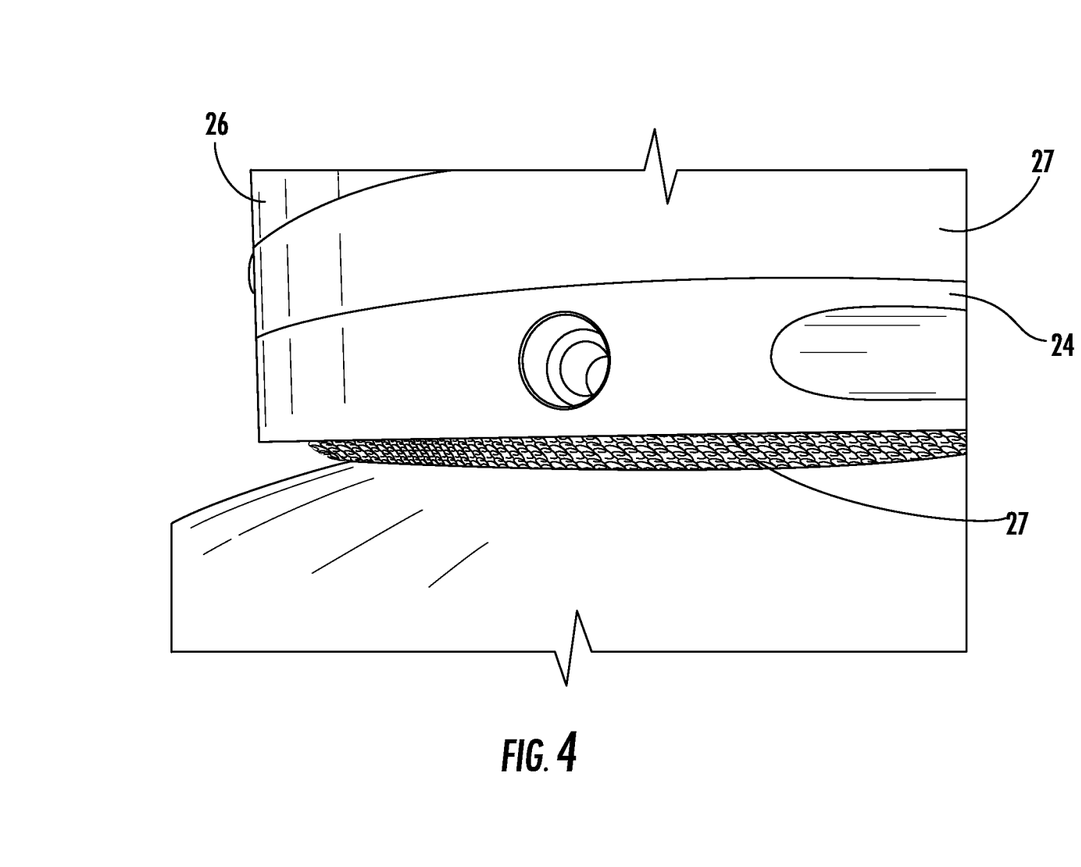
FIG. 4 shows a wire mesh of the sensor unit of FIG. 1 in uniform contact with a glass insulator disc.

Referring to FIGS. 2-4, the sensor unit 20 attaches to the cap 14 of the insulator disc and includes (1) sensor disc 21 formed of two halves 21A and 21B connected by a pair of hinges 22 on a first end to permit the two halves 21A and 21B to pivot relative to each other and permit a second end of the sensor disc 21 to open and receive the cap 14 therein and (2) a grounded housing 23 connected to the sensor disc 21. The housing 23 contains the electronics to measure and communicate the leakage currents (discussed below) and is attached to the sensor disc 21 via an electrically conductive bracket 29 to an upper disc set 26 of the sensor disc 21.

The sensor disc 21 includes (1) a conducting lower disc set 24, (2) the conducting upper disc set 26, (3) an insulating disc set 27 sandwiched between and connected to the lower and upper disc sets 24 and 26 respectively, and (4) a conducting stainless steel mesh 28 connected to a bottom of the lower disc set 24 and adapted to provide uniform contact with an insulator surface. The insulating disc set 27 prevents the leakage currents from flowing from the lower disc set 24 to the upper disc set 26. A locking mechanism, such as a bolt or other suitable fastener, secures the two halves 21A and 21B together once the sensor disc 21 is installed around the cap 14.

As shown, the sensor unit 20 is connected to the cap 14 by sharpened bolts 25 threaded through the upper disc set 26 which apply pressure to the cap 14 of the insulator and hence result in both mechanical attachment and electrical contact. The sharpened end of the bolts 25 penetrate through any insulating barrier (e.g. contaminants on the cap) to provide an effective ground path for the leakage current (i.e., the upper disc set 26 is grounded to the cap via the sharpened bolts 25). The threaded nature of the sharpened bolts 25 allow different insulator cap dimensions to be accounted for (adjusted in the field).

Referring to FIGS. 5-8, the housing 23 is generally rectangular and includes two spaced-apart sidewalls 36, two spaced-apart endwalls 38, a bottom wall 40, and a top wall 42. When used herein, the directional terms "top", "bottom", "side", etc. are merely for reference and do not imply that any specific orientation of the sensor unit 20 is required.

A sensor assembly is mounted in the housing 23. The configuration of the sensor assembly may be varied to suit a particular application. In the example shown in FIG. 5, the sensor assembly 44 includes a bolt 46 extending completely through the housing 23 and having upper and lower ends 48 and 50. The upper end 48 of the bolt 46 passes through a clearance hole 52 in the top wall 42 and is received in an insulator 54. The lower end 50 of the bolt 46 passes through a hole in the bottom wall 40. The bolt 46 is secured in place by upper and lower clamp nuts 56 and 58, respectively. When assembled, the upper end 48 of the bolt 46 is not electrically connected to the housing 23 and the lower end 50 is electrically connected to the housing 23. A binding nut 60 is provided at the upper end 48 to secure a first end of a transfer lead 32 to the bolt 46. As shown in FIG. 3, a second opposing end of the lead 32 is electrically attached to the lower disc set 24.

Figure 5:
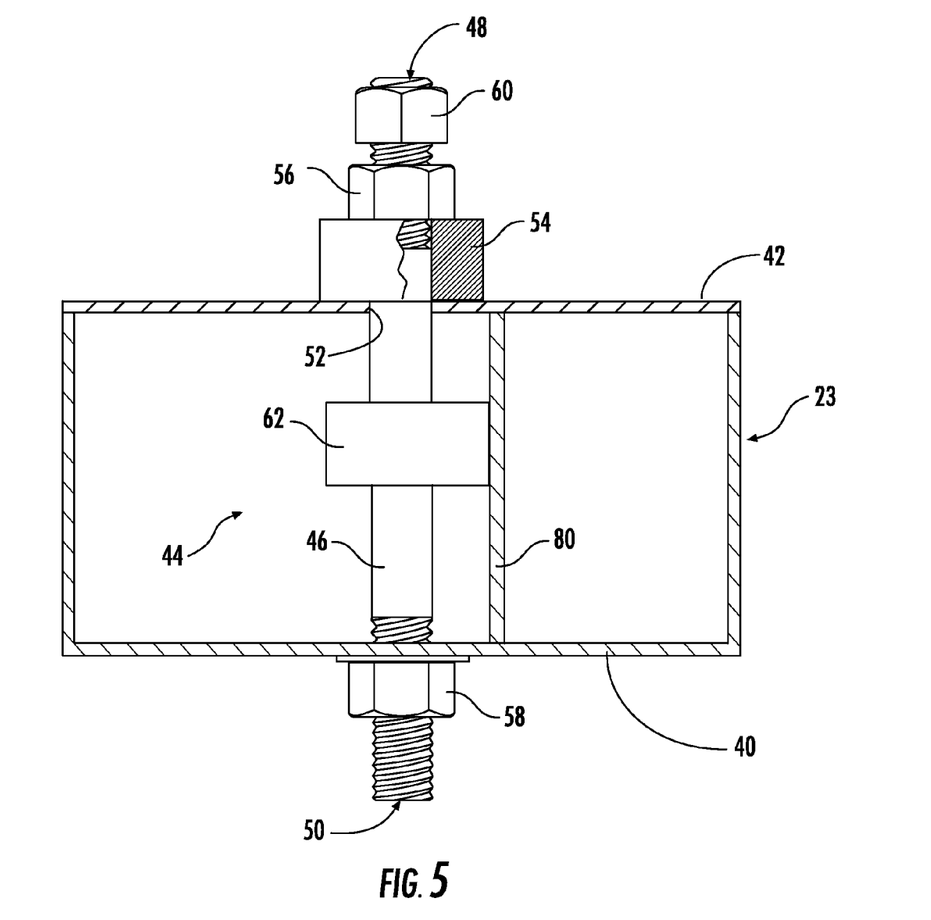
FIG. 5 is a partially-sectioned view of a sensor unit showing a first configuration of a sensor assembly therein.

The bolt 46 passes through the interior opening of a toroidal current transformer 62 of a known type. The current transformer 62 functions as a sensor providing a voltage output which is proportional to the leakage current flowing in the bolt 46. The frequency response of available current transformers is from less than 10 Hz to greater than 100 kHz. Preferably, the current transformer 62 is a ferrous current transformer with a straight current conductor as primary winding. The saturation characteristics of the magnetic circuit and low impedance of the primary winding protects the internal electronics of the sensor unit 20 from overvoltages.

Figure 6:
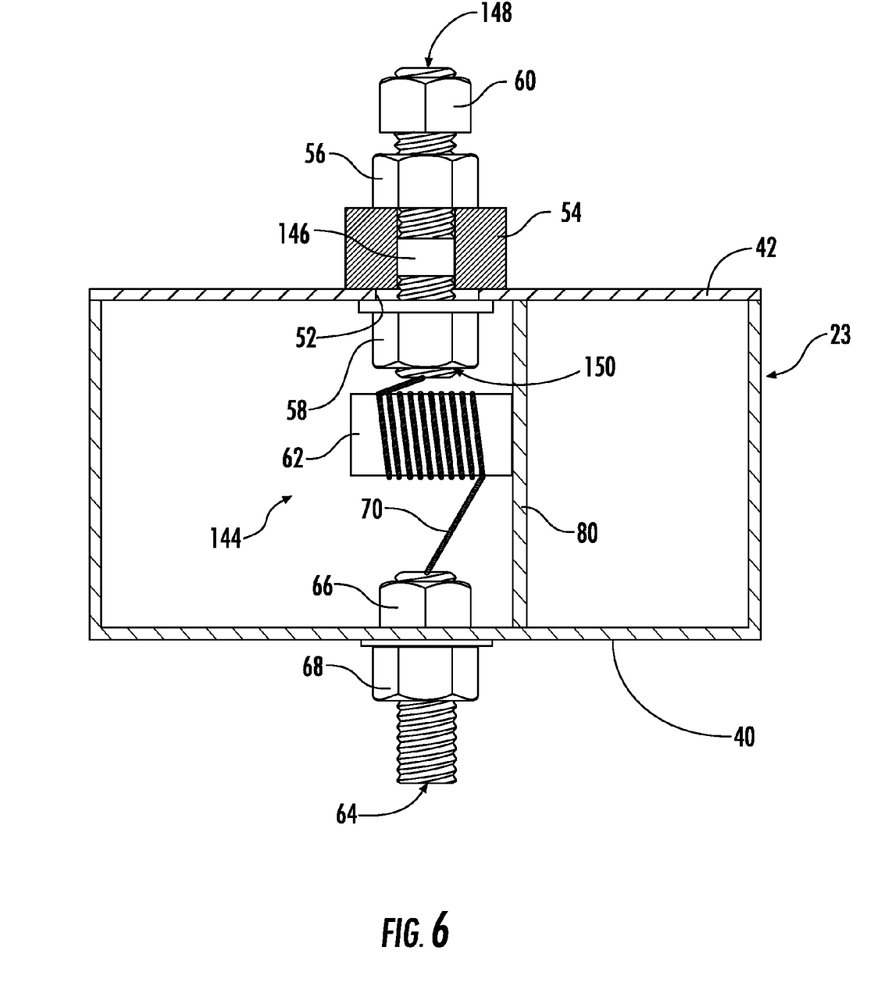
FIG. 6 is a partially-sectioned view of a sensor unit showing a second configuration of a sensor assembly therein.

FIG. 6 shows an example of another sensor configuration. The sensor assembly 144 includes a bolt 146 having upper and lower ends 148 and 150. The upper end 148 of the bolt 146 passes through a clearance hole 52 in the top wall 42 of the housing 23 and is received in an insulator 54. The lower end 150 of the bolt 146 protrudes a short distance through the top wall 42. The bolt 146 is secured in place by upper and lower clamp nuts 56 and 58, respectively. When assembled, the upper end 148 of the bolt 146 is not electrically connected to the housing 23. A binding nut 60 is provided at the upper end 148 to secure the first end of the transfer lead 32 to the bolt 146. As shown in FIG. 3, the second opposing end of the lead 32 is electrically attached to the lower disc set 24.

A ground post 64 is also provided which passes through the bottom wall 40 and is secured in place by upper and lower clamp nuts 66 and 68, respectively. When assembled, the ground post 64 is electrically connected to the housing 23.

A toroidal current transformer 62 of a known type, like the one described above, is positioned inside the housing 23 below the lower end 150 of the bolt 146. A ground lead 70 is connected to the lower end 150 of the bolt 146, passes through or near the current transformer 62 and then connects to the ground post 64. In order to increase the gain of the current transformer 62, the ground lead 70 may be wrapped around the current transformer 62 one or more times, as shown. This may be useful, for example, to increase the sensitivity of the sensor unit 20 when investigating wood pole fires caused by contamination.

Figure 7:
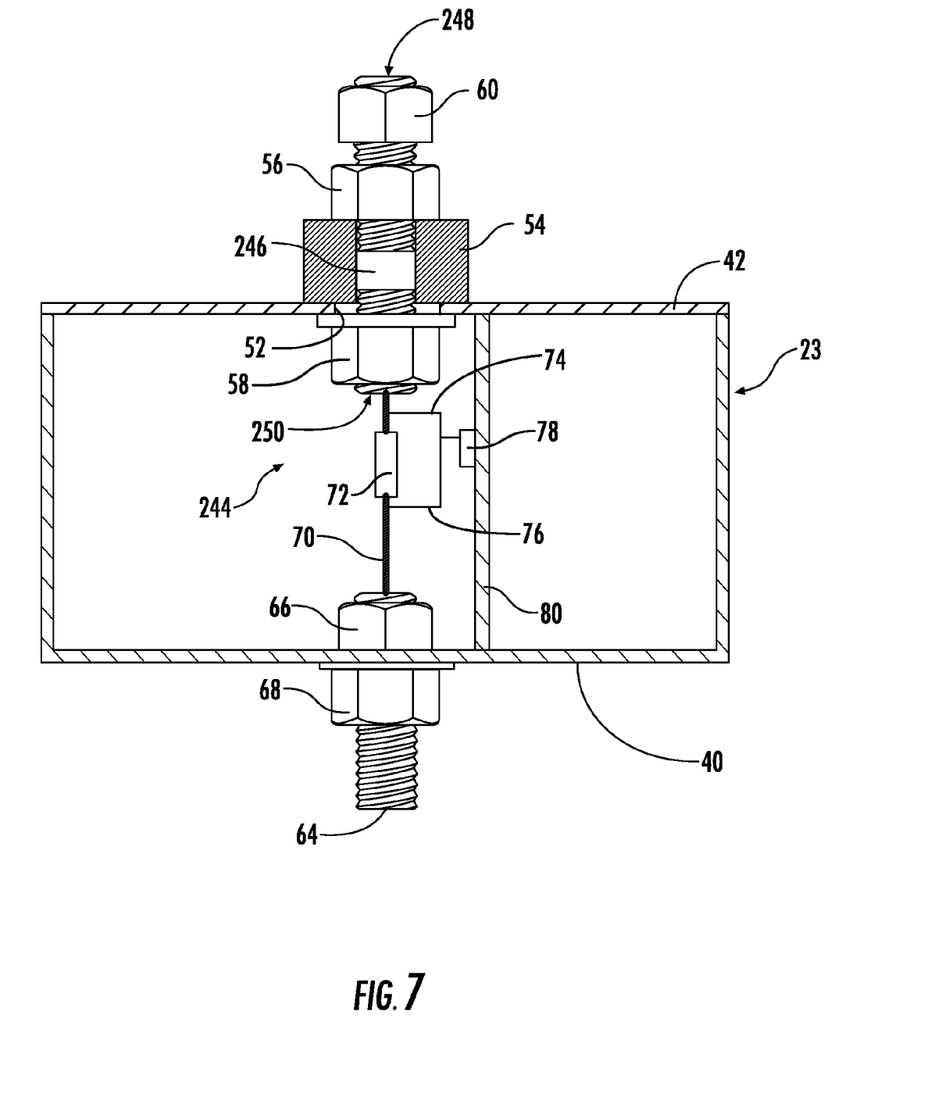
FIG. 7 is a partially-sectioned view of a sensor unit showing a third configuration of a sensor assembly therein.

FIG. 7 shows an example of yet another sensor configuration. The sensor assembly 244 includes a bolt 246 having upper and lower ends 248 and 250. The upper end 248 of the bolt 246 passes through a clearance hole 52 in the top wall 42 of the housing 23 and is received in an insulator 54. The lower end 250 of the bolt 246 protrudes a short distance through the top wall 42. The bolt 246 is secured in place by upper and lower clamp nuts 56 and 58, respectively. When assembled, the upper end 248 of the bolt 246 is not electrically connected to the housing 23. A binding nut 60 is provided at the upper end 248 to secure the first end of the transfer lead 32 to the bolt 246. As shown in FIG. 3, the second opposing end of the lead 32 is electrically attached to the lower disc set 24.

A ground post 64 is also provided which passes through the bottom wall 40 and is secured in place by upper and lower clamp nuts 66 and 68, respectively. When assembled, the ground post 64 is electrically connected to the housing 23.

A ground lead 70 is connected between the lower end 250 of the bolt 246 and the ground post 64. A resistor 72 having a known resistance is connected in-line with the ground lead 70. Lines 74 and 76 from a voltage transducer 78 are connected to the ground lead 70 upstream and downstream of the resistor 72, respectively, such that the voltage transducer 78 can measure the voltage drop across the resistor. From this, the current flowing through the resistor may be computed from Ohm's Law as $I=V/R$, where I is current, V is voltage, and R is resistance The sensor assembly (like the sensor assemblies 44, 144, or 244 described above) is operably connected to a electronics module 80 which functions to receive, process, and store signals from the sensor assembly, to receive external commands, and to transmit data to an external source. The electronics module 80 may include, for example, a printed circuit board incorporating analog, digital and/or radio-frequency ("RF") electronic components. The electronics module 80 may incorporate discrete components and/or one or more microprocessors. the components of the electronics module 80 may embedded in potting compound to protect them environmental influences.

Figure 8:
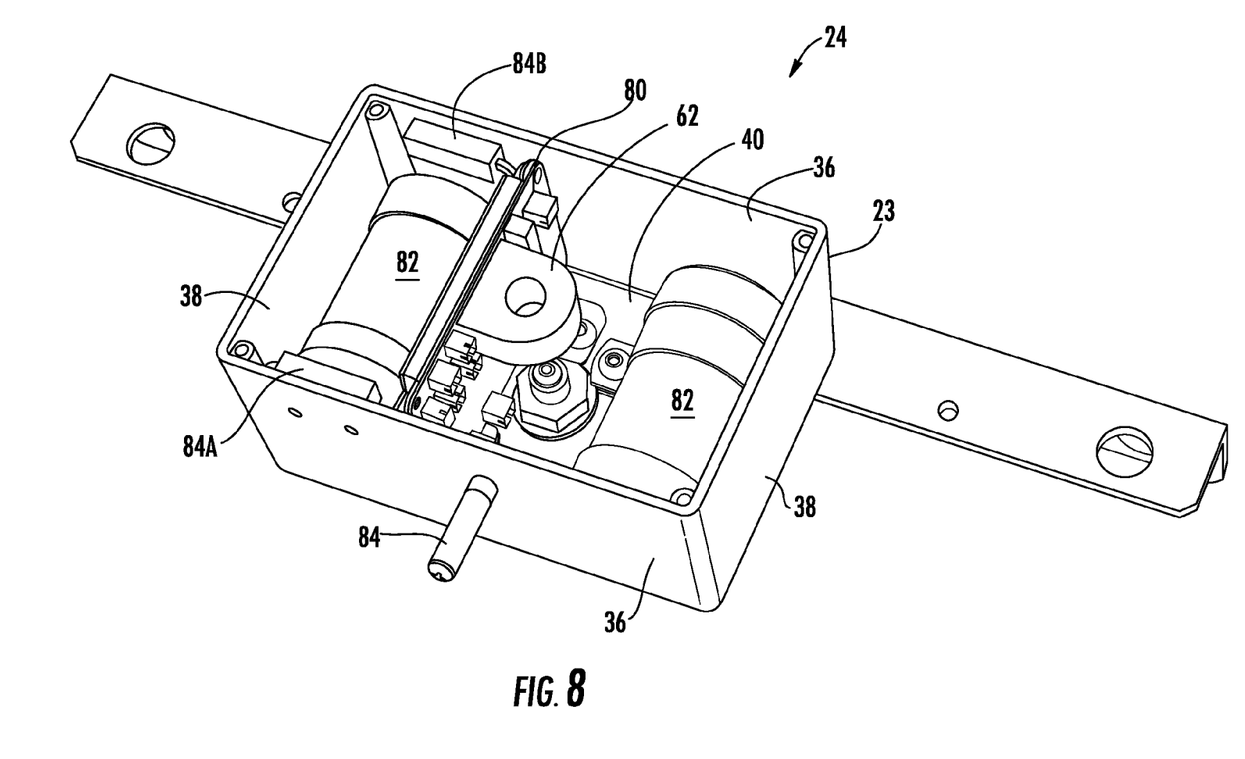
FIG. 8 is a perspective view of the sensor unit with its' cover removed to show the electronics contained therein.
Figure 9:
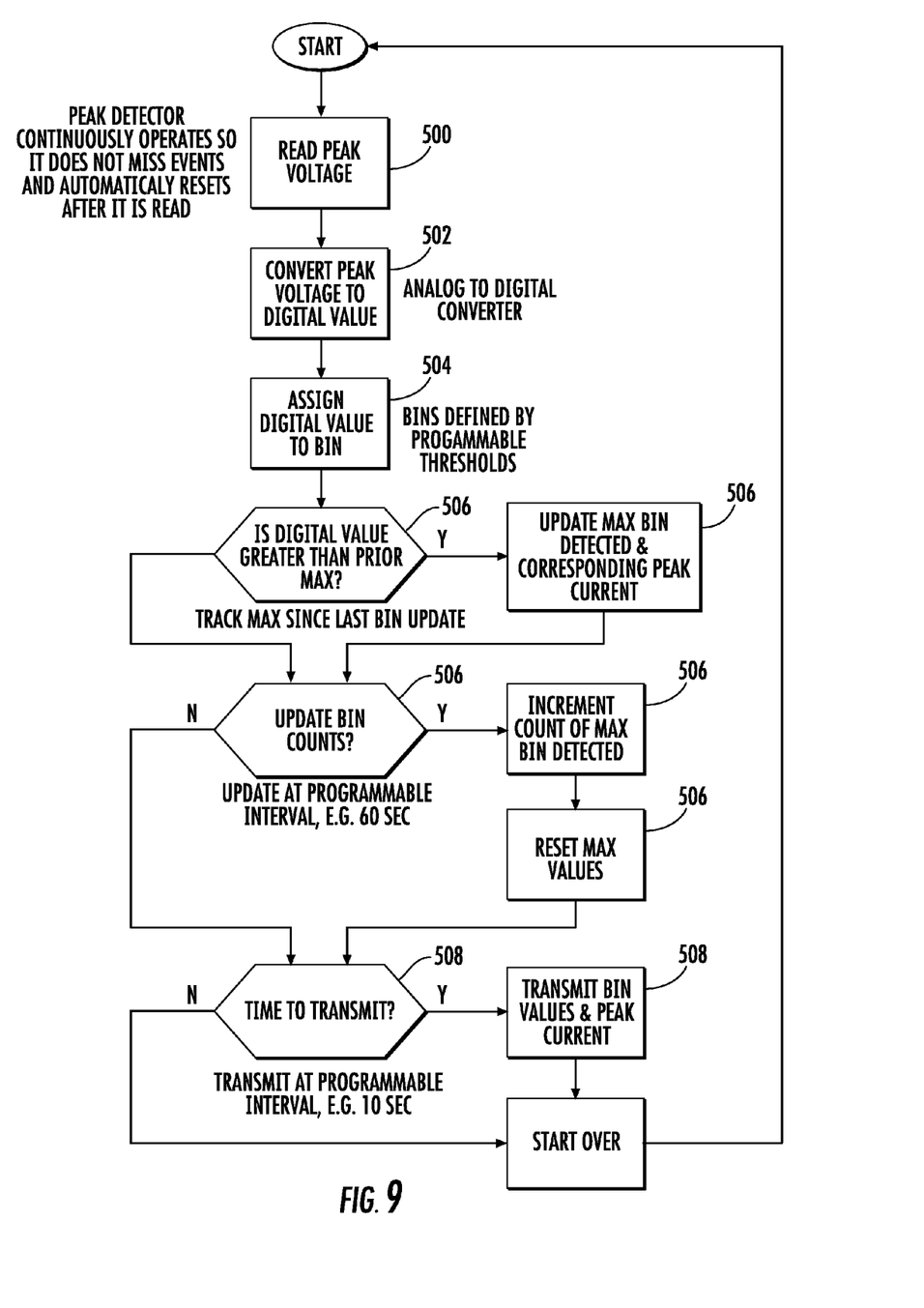
FIG. 9 is a block diagram showing the operation of a sensor unit.

In addition to the electronics module, the housing 23 includes an electric power source for the electronics module 80, such as the illustrated batteries 82. Power may also be provided to the electronics module 80 via harvesting power from magnetic and electrical fields, solar, or any other suitable source. The housing 23 also includes one or more RF antennas 84 which protrude from the exterior of the housing 23 and are used to transmit signals generated by the electronics module 80 to a remote receiver (not shown), and/or to receive RF signals from a remote receiver (not shown). The sensor unit 20 incorporates a communication system that may be based on the IEEE 805.15.4 architecture. The communication protocol allows two-way communications.

In the illustrated example, magnetically-operated switches are mounted inside the housing 23 and coupled to the electronics module 80. The switches can be tripped by placing a magnet 86 the near vicinity of the switch on the outside of the housing 23. In the illustrated example, the sensor unit 20 includes a power switch 84A which toggles the sensor unit 20 between the on and off state, and a reset switch 84B which signals the sensor unit 20 to erase any stored data.

The electronics module 80 may include a temperature sensor (not separately illustrated) in order to assist in assessing condensation conditions. The electronics module 80 may also include a 3D accelerometer (not separately illustrated), in order to assess whether the insulator or structure is experiencing vibration issues.

In operation, the stainless steel mesh 28 intercepts the leakage currents from the insulator surface and transfers them to the lower disc set 24. The currents are then transferred from the lower disc set 24 to the sensor assembly in the housing 23 via lead 32 for processing. The leakage current then flows from the sensor assembly in the housing 23 to the upper disc set 26 and to the cap 14 via the bracket 29 and bolts 25.

The operation of the electronics module 80 and the sensor assembly will now be described with reference to the block diagram in FIG. 7. In block 500, the electronics module 80 uses a peak detect circuit of a known type to measure and hold a voltage signal from the sensor assembly described above. The voltage signal is proportional to the highest leakage current measured in a predetermined first time interval, e.g. 60 seconds. This peak detect circuit is reset at the first interval, e.g. 60 seconds, based on a digital signal from the microprocessor. At block 502, an Analog to Digital (A/D) converter (which may be part of a microprocessor of the electronics module 80) measures the value from the peak detect circuit, repeating as the first interval. At block 504, the microprocessor evaluates the digital value and assigns the value to membership in a category or "bin". The bin represents a range in which the measured value lies. For example, there may be six numbered bins which account for different leakage current magnitudes. Examples of two different settings for the leakage current threshold for the bins are listed in Table 1 below, in which "regular" indicates a classification that is relatively less sensitive to leakage currents and "sensitive" indicates a classification that is relatively more sensitive to leakage currents.

TABLE 1

| BIN NUMBER | CURRENT RANGE, REGULAR (PEAK mA) | CURRENT RANGE, SENSITIVE (PEAK mA) |
| --- | --- | --- |
| 1 | 0-10 | 0-1 |
| 2 | 10-20 | 1-2 |
| 3 | 20-50 | 2-5 |
| 4 | 50-200 | 5-20 |
| 5 | 200-500 | 20-50 |
| 6 | 500+ | 50+ |

The electronics module 80 maintains a counter for each of the bins. When the digital value is assigned to a bin, the counter for that bin is incremented (see block 506). At block 508, the number of counts in each bin and the maximum leakage current in that period is then transmitted using RF to a remote receiver. The transmission repeats at a second interval which is preferably shorter than the first interval described above.

The sensor unit 20 only stores the statistical parameters (i.e. the bin counts) of the leakage current peaks that occur. No other leakage current parameters need be recorded. Using the communications system described above, a remote user can reset the bins or change the ranges of the bins remotely.

The sensor unit 20 also keeps track of the time since the last reset. This limits the data message sent by the device to the bare minimum. It also limits the internal circuit complexity and power consumption for the device. Based on the battery characteristic and low power consumption of the sensor unit 20, battery life is estimated at more than 10 years.

The sensor units 20 can be employed in different modes. For example, when installed on transmission lines the sensor units 20 may be polled a only few times per year when line maintenance crews do inspections or maintenance, for example using handheld receivers (not shown).

Alternatively, in substations or on specific transmission line structures a more sophisticated approach may be followed. A dedicated base station system (not shown) installed at the substation/structure would poll the nearby sensor units 24 at a short time interval. This base station stores leakage current data together with weather parameters from attached sensors. The data is then transmitted from the base station using a variety of methods including the use of GPRS modems or connecting to a utility data management system. The data is stored and processed on a remote server. Alarms can be generated based on algorithms and data can be viewed using visualization tools.

If the leakage current characteristics of the insulators are known, alarms can be generated automatically based on preset leakage current alarm levels. Warnings or alarms can be raised to initiate insulator maintenance (e.g. washing) if certain pre-set leakage current thresholds are exceeded. Leakage current information can also be used select appropriate mitigation measures.

It should be noted that the sensor units 20 are connected between the insulator and the grounding system. With this configuration the insulator leakage current is directly shunted to ground and it will therefore not pass through the wood cross arm. The leakage currents measured can however be used to raise warnings that conditions and insulator contamination levels are sufficiently high to cause wood pole fires.

The sensor unit 20 described above has several advantages. The sensor units 20 are suitable for wide spread deployment which makes them practical for installations on overhead lines and substations. Some of the specific advantages of the sensor are low cost; absence of wiring to either power the sensor unit 20 or communicate with the sensor 20, leading to improved reliability compared to wired units; the ability to quickly deploy many sensor units 20; on-board processing of data, providing a user with processed information on which he can make a decision; and a combination of analog and digital electronics, ensuring that no current pulses are ever missed, as compared to previous technologies that used digital measurement only.

The foregoing has described an apparatus and method for accurately detecting and monitoring leakage currents on porcelain and glass insulator disc strings. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. A sensor apparatus for detecting and monitoring leakage currents on insulator disc strings of an electrical power system, the apparatus comprising:
   (a) a sensor unit configured to attach to a cap of an insulator disc string, the sensor unit includes:
      (i) a sensor disc configured to surround the cap, the sensor disc includes a conducting lower disc set, a conducting upper disc set, an insulating disc set sandwiched between the upper and lower conducting disc sets, and a conducting mesh connected to a bottom of the lower disc set to provide uniform contact with a surface of the insulator disc; and
      (ii) a housing connected to the sensor disc, the housing including electronics configured to measure and communicate leakage currents on an insulator disc; and
   (b) wherein leakage currents on the surface of the insulator disc are intercepted by the mesh of the sensor disc and transferred to the housing for processing and communication by the electronics.

2. The sensor apparatus according to claim 1, wherein the sensor disc is formed of two halves interconnected by at least one hinge to allow the two halves to pivot relative to each other and allow the sensor disc to be installed around the cap.

3. The sensor apparatus according to claim 1, wherein the insulating disc set prevents leakage currents from transferring from the lower disc set to the upper disc set.

4. The sensor apparatus according to claim 1, wherein the sensor unit is attached to the cap by bolts extending through the upper disc set to the cap, wherein the bolts are tightened to apply pressure to the cap, thereby providing a mechanical and electrical connection.

5. The sensor apparatus according to claim 1, wherein:
  (a) the leakage currents are transferred from the conducting mesh to the lower disc set;
  (b) a sensor assembly of the electronics is electrically connected to the lower disc set by a transfer lead and the leakage currents are transferred from the lower disc set to the sensor assembly for processing;
  (c) the housing is connected to the upper disc set by a conductive bracket such that leakage currents processed by the sensor assembly are transferred to the upper disc set by the bracket; and
  (d) the upper disc set is connected to the cap by bolts extending through the upper disc set such that a mechanical and electrical connection is formed between the upper disc set and cap so that the leakage currents transferred to the upper disc set are transferred to the cap by the bolts.

6. The sensor apparatus according to claim 1, wherein the electronics include:
  (a) a sensor assembly operable to generate an analog signal proportional to a received leakage current;
  (b) an electronics module operable to convert the analog signal to a digital value;
  (c) a communications system operable to wirelessly transmit the digital value to an external receiver; and
  (d) a transfer lead interconnecting the sensor assembly and the lower disc set, the transfer lead operable to transfer leakage current from the lower disc set to the sensor assembly.

7. The sensor apparatus of claim 6, wherein the electronics module is operable to assign the digital value to one of a plurality of bins based on the magnitude of the digital value, wherein each of the plurality of bins represents a predetermined range of magnitudes of leakage current.

8. The sensor apparatus of claim 7, wherein the electronics module is operable to detect a peak value of the analog signal at a first interval and convert the peak value to the digital value, and wherein the electronics module is operable to increment the assigned bin each time a digital value is assigned to a bin.

9. A sensor unit configured to attach to a cap of an insulator disc string of an electrical power system and detect and monitor leakage currents flowing on the insulator disc string, the sensor unit comprising:
  (a) a sensor disc configured to surround and connect to the cap, the sensor disc includes:
    (i) a conducting lower disc set;
    (ii) a conducting upper disc set;
    (iii) an insulating disc set sandwiched between the upper and lower conducting disc sets; and
    (iv) a conducting mesh connected to a bottom of the lower disc set to provide a uniform contact between the sensor disc and a surface of an insulator disc;
  (b) a housing connected to the upper disc set by a conducting bracket, the housing including electronics configured to measure and communicate leakage currents on an insulator disc, the electronics including:
    (i) a sensor assembly operable to generate an analog signal proportional to a received leakage current;
    (ii) an electronics module operable to convert the analog signal to a digital value;
    (iii) a communications system operable to wirelessly transmit the digital value to an external receiver; and
    (iv) a transfer lead interconnecting the sensor assembly and the lower disc set, the transfer lead operable to transfer leakage current from the lower disc set to the sensor assembly; and
  (c) wherein leakage currents on a surface of the insulator disc are intercepted by the sensor disc and transferred to the housing for processing and communication by the electronics.

10. The sensor unit according to claim 9, wherein the conducting mesh intercepts the leakage currents and transfers the leakage currents to the lower disc set for transfer via the transfer lead to the sensor assembly.

11. The sensor unit according to claim 9, wherein the sensor disc is connected mechanically and electrically to the cap by bolts extending through the upper disc set.

12. The sensor apparatus of claim 9, wherein the sensor assembly comprises:
  (a) a current transformer operably connected to the electronics module and having an opening therein; and
  (b) an electrode having a first end electrically isolated from the housing and coupled to the transfer lead, and a second end electrically coupled to the housing, the electrode passing through the opening of the current transformer.

13. The sensor apparatus of claim 9, wherein the sensor assembly comprises:
  (a) a current transformer operably connected to the electronics module and having an opening therein;
  (b) an electrode coupled to the transfer lead; and
  (c) a ground lead having a first end electrically isolated from the housing and coupled to the transfer lead, and a second end electrically coupled to the housing, the ground lead passing through or in close proximity to the current transformer.

14. A method of detecting leakage current in an insulator disc string of an electrical power system, comprising the steps of:
  (a) providing a sensor unit having:
    (i) a sensor disc configured to surround and attach to a cap of the insulator disc string; and
    (ii) a housing electrically connected to the sensor disc and having electronics configured to measure and communicate leakage currents on an insulator disc of the insulator disc string;
  (b) opening the sensor disc to receive the cap therein;
  (c) closing the sensor disc such that a ring is formed around the cap;
  (d) securing the sensor disc to the cap using sharpened bolts, wherein the bolts extend through an upper disc set of the sensor disc and penetrate through an insulating barrier on the cap to provide a mechanical and electrical connection;
  (e) conducting a leakage current from an insulator disc of the insulator disc string through a lower disc set of the sensor disc to the electronics; and
  (f) using the electronics to measure and communicate the leakage currents to an external receiver.

15. The method according to claim 14, further including the steps of:
  (a) using a sensor assembly of the electronics, generating an analog signal proportional to the leakage current;
  (b) using an electronics module of the electronics, converting the analog signal to a digital value; and (c) using a communications system of the electronics, wirelessly transmitting the digital value to an external receiver.

16. The method according to claim 14, further including the step of attaching the sensor disc to the cap, wherein the sensor disc includes a first half pivotally connected to a second half to allow the sensor disc to be opened on one end and receive the cap therein.

* * * * *